United States Patent [19]
Cline et al.

[11] Patent Number: 6,016,020
[45] Date of Patent: Jan. 18, 2000

[54] METHOD AND APPARATUS USING LOW VOLTAGE LEVEL ACTUATOR TO CONTROL OPERATION OF ELECTRICAL APPLIANCE

[75] Inventors: David J. Cline, Newport Beach; Paul Rosenau, Santa Ana, both of Calif.

[73] Assignee: Balboa Instruments, Inc., Costa Mesa, Calif.

[21] Appl. No.: 08/922,757

[22] Filed: Sep. 3, 1997

[51] Int. Cl.[7] ................................................. B02C 18/40
[52] U.S. Cl. .............................. 307/125; 307/115; 361/1; 236/1 F; 241/46.013
[58] Field of Search ..................................... 307/112, 139, 307/140, 115, 38, 125; 310/800; 331/34; 361/1; 304/707; 315/209 PZ; 327/369; 236/1 F; 241/46.013

[56] References Cited

U.S. PATENT DOCUMENTS

| | | |
|---|---|---|
| 2,587,304 | 2/1952 | Fiske, Jr. et al. . |
| 3,206,647 | 9/1965 | Kahn . |
| 3,239,696 | 3/1966 | Burkhalter . |
| 3,307,052 | 2/1967 | Neilson et al. . |
| 3,387,149 | 6/1968 | Young . |
| 3,564,303 | 2/1971 | Geil et al. . |
| 3,659,615 | 5/1972 | Enger . |
| 3,763,464 | 10/1973 | Laurent . |
| 3,935,485 | 1/1976 | Yoshida et al. . |
| 4,159,496 | 6/1979 | Stevens ..................................... 307/112 |
| 4,328,441 | 5/1982 | Kroeger et al. ........................... 331/34 |
| 4,510,778 | 4/1985 | Cotton ......................................... 68/12 |
| 4,618,797 | 10/1986 | Cline . |
| 5,332,944 | 7/1994 | Cline . |
| 5,455,490 | 10/1995 | Callahan et al. ........................ 315/194 |
| 5,499,184 | 3/1996 | Squibb ..................................... 363/100 |
| 5,539,166 | 7/1996 | Reier . |
| 5,590,343 | 12/1996 | Bolan et al. ............................. 364/707 |

*Primary Examiner*—Albert W. Paladini
*Attorney, Agent, or Firm*—Joseph F. McLellan

[57] ABSTRACT

A method and apparatus utilizing a low voltage level actuator and a signal processing device such as a microprocessor to selectively electrically couple an electrical appliance with a switch circuit associated with a power source of relatively high voltage. The microprocessor is responsive to low level electrical signals from the actuator to control operation of the switch circuit and the appliance without posing a shock hazard to the user. One form of actuator includes a piezoelectric element.

12 Claims, 2 Drawing Sheets

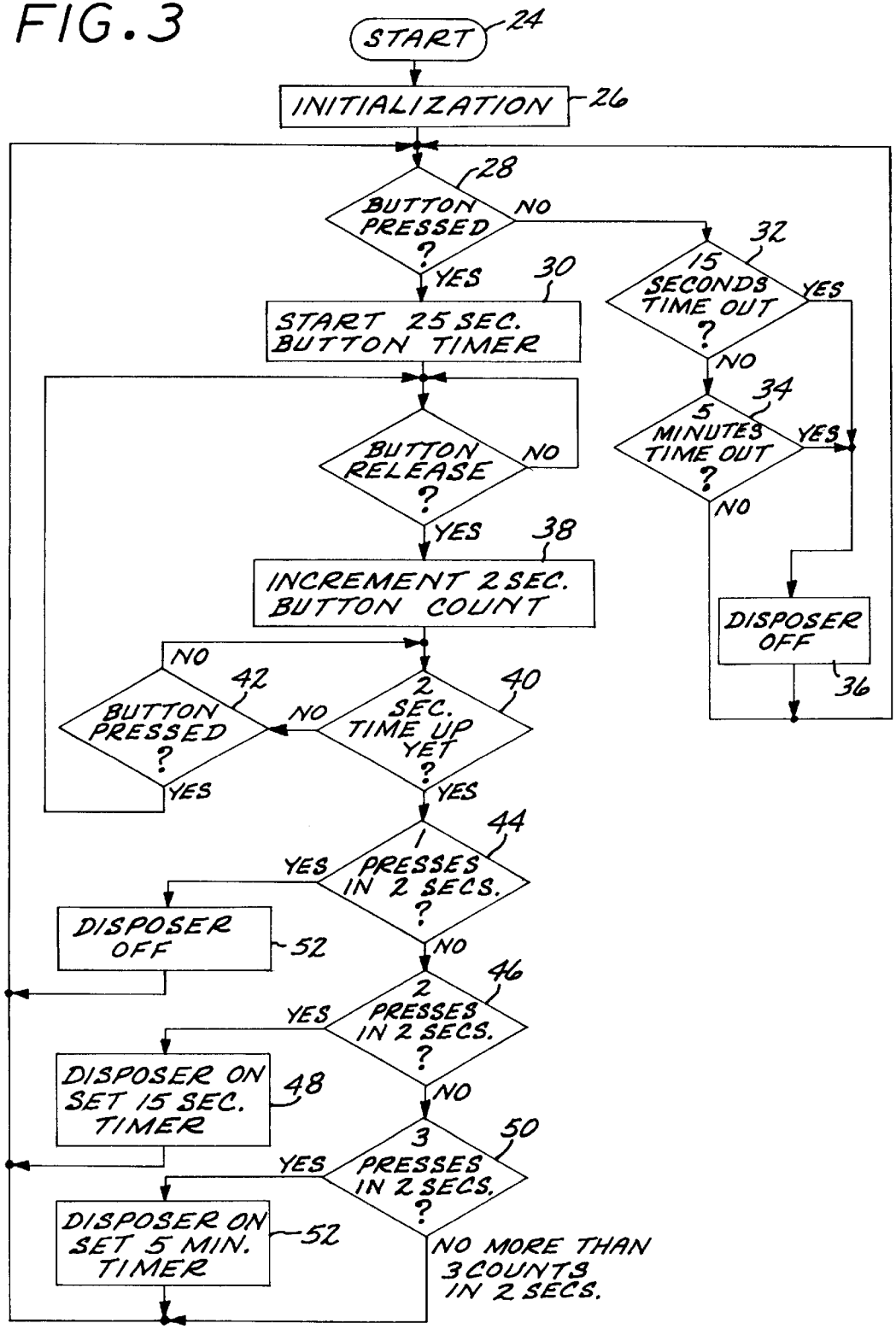

METHOD AND APPARATUS USING LOW VOLTAGE LEVEL ACTUATOR TO CONTROL OPERATION OF ELECTRICAL APPLIANCE

FIELD OF THE INVENTION

The present invention relates to a method and apparatus that use a low voltage level actuator and a signal processing device such as a microprocessor to electrically couple an electrical appliance such as a household garbage disposer with a switch circuit associated with a power source of relatively high voltage. The arrangement eliminates the possibility of a user experiencing any electrical shock, even in the presence of moisture and water.

DESCRIPTION OF THE PRIOR ART

A household appliance such as a garbage disposer is typically turned on and off by a wall or kitchen counter toggle switch that is near the sink. The proximity of the switch to water and to the wires carrying line voltage, and the fact that the user's hands are often wet, presents a potential electrical shock hazard. This hazard is also presented when the switch is cleaned with a swipe of a damp cloth, in addition to which the switch can be inadvertently turned on during such cleaning. This may or may not pose an additional hazard, depending upon the circumstances.

Prior art switches normally have only an on-off capability. Once the disposer is actuated it continues to operate until it is manually shut off, which can be wasteful.

U.S. Pat. No. 5,539,166 (Gerald J. Reier) teaches a pneumatically actuated switch having an actuator housed within a recess into which it can be moved or pressed to turn on the garbage disposer. The actuator is located remotely of the wires that carry line voltage. Only an on-off capability is disclosed. There is no provision for automatic shutoff The actuator must be pressed into its housing recess enough to compress an associated bellows. This forces air through an air conduit extending to the switch mechanism. The resulting compressed air column actuates the switch mechanism.

However, pressing the actuator into its recess is sometimes awkward for persons with short fingers or long fingernails. Moreover, the cavity can become clogged with accumulated dirt and other foreign matter that must be cleaned out to enable proper depression of the actuator. Also, leakage in the air conduit or separation of one or both of the conduit ends from the actuator and the switch mechanism prevents development of the air column necessary to actuate the switch mechanism. The actuator is also subject to the usual mechanical failures associated with moving parts.

SUMMARY OF THE INVENTION

According to the present invention, a method and apparatus are provided which use a low voltage level switch or actuator and a signal processing device such as a microprocessor to selectively electrically couple an electrical appliance such as a garbage disposer with a switch circuit that is associated with a power source of relatively high voltage.

The actuator is typically mounted on the kitchen sink counter or to the adjacent wall, with the switch circuit and microprocessor preferably mounted below the counter near the disposer.

Pressing a deflectable area or button of the actuator applies low level electrical signals to the microprocessor through a telephone type cable which leads from the actuator. This in turn controls operation of the switch circuit and the appliance. Since the cable carries only the very low level electrical signal developed by the actuator, there is no danger from electrical shock even if water is present on or near the actuator. In one version of the invention a first signal can be used to turn the disposer on, and a second signal used to turn it off. Many variations are possible, depending upon the programming of the microprocessor.

In an exemplary embodiment, the system is programmed so that one button press will always turn off the disposer, but will be ineffective to turn it on. This essentially eliminates inadvertent operation of the disposer.

Two button presses within a predetermined time period will cause the disposer to operate for a predetermined period of time, while three button presses will cause it to operate for a longer period. When the particular period of time has elapsed, the disposer will automatically shut off. This enables the user to turn on the disposer for the length of time the user selects to accomplish the task at hand.

The present actuator apparatus can be relatively quickly associated with an existing disposer installation. The actuator is easily fitted to the counter top, for example, and the connecting cable from the actuator extended to an under-the-counter mounted microprocessor and switch circuit associated with the disposer.

One form of low voltage level actuator is a piezoelectric actuator such as that described in my U.S. Pat. Nos. 4,618, 797 and 5,332,944. Such an actuator utilizes a piezoelectric element which is completely encapsulated in waterproof-potting material. The actuator is operative to generate the very low level voltage electrical signal which accompanies deflection of a piezoelectric material, and the potting material is resiliently deformable or flowable so that it allows the slight movement or flexing of the piezoelectric element required to generate the signal. However, the potting material is without voids into which moisture or the like can enter.

Other aspects and advantages of the present invention will become apparent from the following more detailed description taken in conjunction with the accompanying drawings.

BRIEF DESCRIPTION OF THE DRAWINGS

FIG. 3 is a flow chart showing the operation of the signal processing means or microprocessor employed in the present invention.

DESCRIPTION OF A PREFERRED EMBODIMENT

Figure 1:
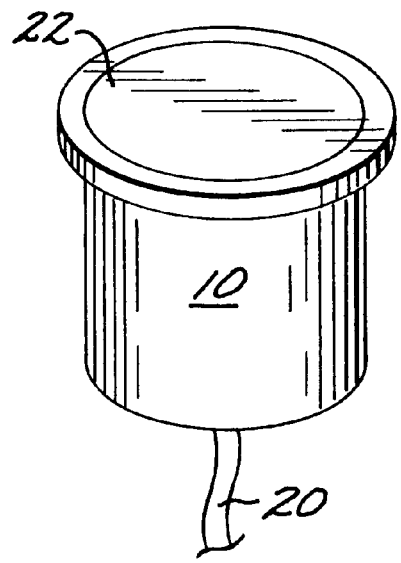
FIG. 1 is a perspective view of a piezoelectric form of low voltage level actuator used in the present invention.

Referring now to the drawings, the present apparatus comprises, generally, a low voltage level piezoelectric type of switch or actuator 10, a control, signal processor or microprocessor 12, and a power supply and switch circuit 14. As will be seen, these control the operation of a household appliance such as a garbage disposer 16.

The generally cylindrical actuator 10 is mounted within a complemental opening which can be drilled or otherwise formed in a mounting surface near the disposer 16. This can be the adjacent kitchen wall or the kitchen countertop 18 surrounding the sink (not shown).

Figure 2:
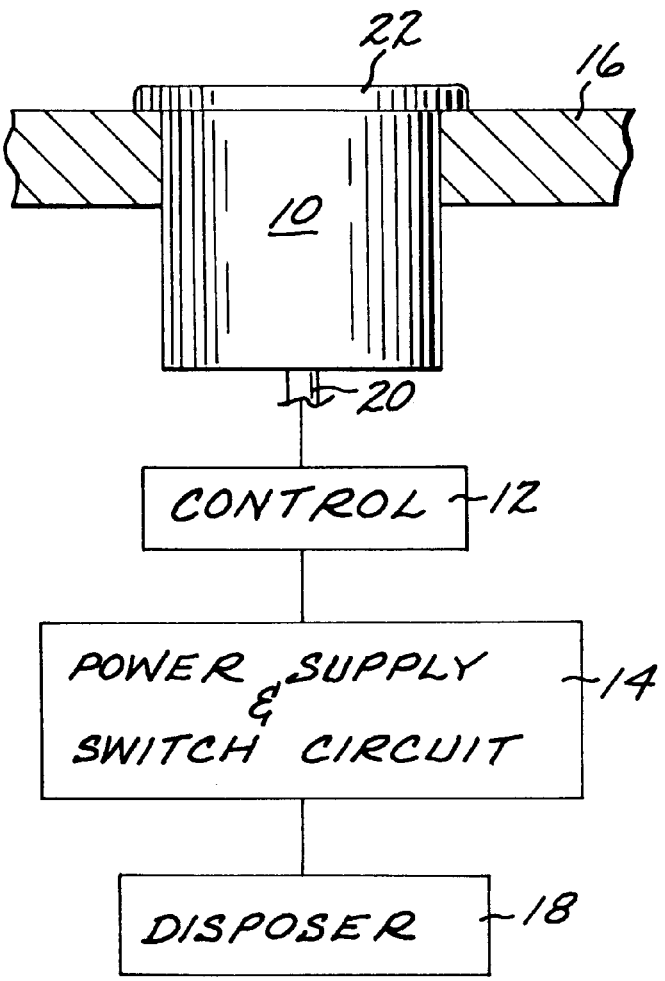
FIG. 2 is a transverse cross-sectional view of the actuator of FIG. 1 mounted to a kitchen counter top, and schematically illustrated in association with other components of the invention which are coupled to a typical household garbage disposer.

The disposer 16 is typical of the many garbage disposers on the market. It is driven by an electric motor connected to a power source associated with the household wiring system through a suitable relay or switch circuit. The switch circuit reduces the relatively high voltage of the household power source to a level suitable for operating the motor. Both the power source and the switch circuit are schematically indicated at 14 in FIG. 2.

In the preferred embodiment of the present system, the piezoelectric actuator 10 is substituted for the typical prior art on-off toggle switch (not shown). The piezoelectric actuator 10 is preferably like that shown and described in U.S. Pat. Nos. 4,618,797 and 5,332,944 and in U.S. patent application Ser. No. 08/897,666, filed Jul. 21, 1997, all of which are owned by the same assignee as the present application. The disclosures of those cases are incorporated herein by reference for details respecting the precise construction of suitable forms of piezoelectric actuators.

The actuator 10 includes an element which can be deformed or flexed to generate a relatively low level electrical signal, as is well known to those skilled in the art. The signal is carried through a conduit such as a typical telephone type cable 20.

The top of the actuator 10 is characterized by a circular deflectable area constituting a button 22 which, through the use of only slight finger pressure, initiates generation of a low level electrical signal. Each pressing of the button generates a separate electrical signal.

The interior of the actuator 10 is filled with an electrically insulating potting compound (not shown) which is deformable or flowable to allow flexing of the piezoelectric signal generating element. It forms an impervious barrier to liquids such as water and allows the actuator to be conveniently located immediately adjacent to the kitchen sink, if desired, without any danger of electrical shock to a user pressing upon the button 22.

The actuator is completely isolated from the relatively high voltage house wiring source.

The microprocessor 12 to which the signal of the actuator 10 is applied may be of any suitable type which can be pre-programmed to perform selected functions. Such microprocessors are readily available in the market, one suitable unit being a P1C 16C 52 microprocessor marketed by Microchip.

The output of the microprocessor 12 is applied to the power supply and switch circuit 14, which is adapted to accept the output to operate the disposer 18, as will be apparent. If desired, the present system can be designed to operate the disposer 18 whenever the button 22 is pressed, and to shut off the disposer 18 whenever the button is again pressed.

However, with reference to FIG. 3, there is illustrated a flow chart depicting operation of the system in accordance with a preferred embodiment of the present invention. The chart shows the manner in which the input signals resulting from a predetermined number of button presses within a two second period are utilized by the microprocessor 12 to operate the disposer 18 in one of three modes: one press of the button will turn off the disposer; two presses within the same time period will cause operation of the disposer for fifteen seconds; and three presses within the same time period will cause operation of the disposer for five minutes.

Of course, the microprocessor can be programmed to respond to different numbers of button presses to accomplish different or additional functions, as desired. Also, the two second time period within which the button presses are recognized can also be adjusted, as well as the duration of disposer operation. In all cases, after the programmed period of operation has elapsed, the disposer automatically shuts off.

In the preferred embodiment, when the system is powered up, a start signal at block 24 is applied to an initialization block 26. The program then first checks for any activity on the control panel.

More particularly, the user button switch at block 28 is scanned. If no button activity is detected, the program enters block 30, checking time-outs for any disposer activity, either a 15 second time-out at block 32, or a 5 minute time-out at block 34. The disposer control will turn off if one of the two timers has timed out (as at block 36).

Whether the disposer control times out or not, it then loops back to the beginning at block 28. If button depression is detected, the flow continues to button activity block 30. Entering block 30, depression of the button for the first time causes the button timer to start the two second clock.

During the two second period the flow follows a loop defined by the function blocks 38, 40 and 42 to calculate the number of button presses occurring within a two second period. Flow then proceeds from block 40 to a number of decisions based upon the number of button presses in the period of two seconds.

If two presses were detected at block 46, the disposer will operate for 15 seconds (block 48). If three presses (block 50) were detected, the disposer will turn on for 5 minutes (block 52), and detection of one press (block 44) will turn the disposer off (block 52). The program then repeats the process, starting again from block 28.

Operation of the present apparatus is begun by actuating the microprocessor 12 and beginning initialization. Thus, if the actuator button 22 is pressed twice within a two second period, the disposer will operate for 15 seconds. Following this it will automatically shut off.

Similarly, pressing the button 22 three times within a two second period will cause the disposer to operate for 5 minutes, following which it will automatically shut off.

A single pressing of the button 22 at any time will shut off the disposer if it is on. However, if it is off, a single pressing of the button will not turn it on. This minimizes inadvertent operation of the disposer.

With the foregoing arrangement the disposer may be operated through the use of an actuator located conveniently close to a kitchen sink, for example, without subjecting the user to any shock hazard. The duration of operation of the disposer can be selected by the user according to the number of his or her button presses, with the disposer automatically shutting off after the selected period of operation has elapsed.

Another useful feature is that the two or three button presses for operating the disposer must occur within a relatively short time (2 seconds in the preferred embodiment) or nothing will happen. This further minimizes inadvertent operation of the disposer.

Any device equivalent to the actuator 10 may be utilized in the present invention, so long as the device is operative to generate a very low voltage level signal comparable to that generated upon flexing of a piezoelectric material. Such a low voltage level signal is necessary to eliminate any potential shock hazard to a user, and to meet the standards of cognizant regulatory bodies which specify acceptable levels of voltage for particular applications.

In addition to piezoelectric actuators, a so-called membrane switch (not shown) may also be used. Such a switch is well known to those skilled in the art. Typically it comprises two thin, spaced apart and confronting layers of plastic material upon which a switching circuit has been imprinted or otherwise applied. In operation, a low voltage level electrical signal, derived from a suitable transformer take-off from the household circuit, is applied to a first circuit portion on one of the layers. Slight pressure on one or the other of the layers brings a second circuit portion on the opposite layer into electrical contact with the first circuit portion. This completes the switching circuit and applies the electrical signal to the microprocessor 12. The operation of the system thereafter is like that already described in connection with the piezoelectric actuator embodiment, as will be apparent.

Although a specific embodiment of the invention has been described and illustrated, it will be understood that the invention is not to be limited to the specific forms or arrangement of parts described and illustrated, and that various changes can be made without departing from the scope of the appended claims.

We claim:

1. A method of using a low voltage level actuator in a potentially moisture laden environment to initiate electrical coupling of an electrical appliance with a switch circuit that is associated with a relatively high voltage power source, the method comprising the steps of:

providing a low voltage level actuator which is electrically isolated from the high voltage power source, and wherein the actuator includes a deflectable area constituting a button whose depression results in passage of a relatively low voltage level electrical signal from the actuator;

locating the button in a working surface accessible to a user; and electrically coupling the actuator to a signal processing means is a microprocessor operative by electrical signals from the actuator to stop operation of the appliance following one button depression, to operate the appliance for one time duration following two button depressions, and to operate the appliance for a second time duration following three button depressions.

2. A method according to claim 1 wherein the actuator includes a deflectable piezoelectric element.

3. A method according to claim 2 wherein the piezoelectric element is deflectable within a resiliently flowable encapsulating material underlying the deflectable portion of the element.

4. A method according to claim 1 wherein the electrical appliance is a garbage disposer located beneath a kitchen sink, and the working surface in which the actuator is located is the sink counter.

5. A method according to claim 4 wherein the switch circuit and microprocessor are located beneath the sink counter, and the actuator is connected by a telephone type cable to the microprocessor.

6. A method of using a low voltage level actuator to initiate electrical coupling of an electrical appliance with a switch circuit that is associated with a relatively high voltage power source, the method comprising the steps of:

providing a low voltage level actuator which is electrically isolated from the high voltage power source, and wherein the actuator includes a deflectable area constituting a button whose depression each time produces a relatively low magnitude electrical signal; and electrically coupling the actuator to a microprocessor which is operative in response to the electrical signal produced by a single depression of the button to electrically isolate the appliance from the power source, and responsive to the pair of electrical signals produced by two successive depressions of the button within a first predetermined time period to electrically couple the electrical appliance to the power source for a first predetermined duration, and responsive to the three electrical signals produced by three successive depressions of the button within a second predetermined time period to electrically couple the electrical appliance to the power source for a second predetermined duration.

7. A method according claim 6 wherein the microprocessor is operative in response to the electrical signal produced by a single depression of the button to decouple the electrical appliance from the power source at all times.

8. Apparatus to electrically couple an electrical appliance with a relatively high voltage power source in a potentially moisture laden environment, the apparatus comprising:

a low voltage level actuator electrically isolated from the power source, and including a deflectable area constituting a button whose depression results in passage of a relatively low voltage level electrical signal from the actuator;

a switch circuit operative for electrically coupling the power source and the electrical appliance; and signal processing means is a microprocessor operative by electrical signals produced from the actuator to stop operation of the appliance following one button depression, to operate the appliance for one time duration following two button depressions, and to operate the appliance for a second time duration following three button depressions.

9. Apparatus according to claim 8 wherein the actuator includes a deflectable piezoelectric element.

10. Apparatus according to claim 9 wherein the piezoelectric element is deflectable within a resiliently flowable encapsulating material underlying the deflectable portion of the element.

11. Apparatus according to claim 8 wherein the electrical appliance is a garbage disposer located beneath a kitchen sink, and the working surface in which the actuator is located is the sink counter.

12. Apparatus according to claim 11 wherein the switch circuit and microprocessor are located beneath the sink counter, and the actuator is connected by a telephone type cable to the microprocessor.

* * * * *